United States Patent [19]

Lester

[11] 4,287,568

[45] Sep. 1, 1981

[54] SOLID STATE MUSIC PLAYER USING SIGNALS FROM A BUBBLE-MEMORY STORAGE DEVICE

[76] Inventor: Robert W. Lester, 46 Abbey Rd., Munsey Park, Manhasset, N.Y. 11030

[21] Appl. No.: 64,454

[22] Filed: Aug. 6, 1979

Related U.S. Application Data

[63] Continuation-in-part of Ser. No. 801,945, May 31, 1977, abandoned.

[51] Int. Cl.[3] .................... G06F 15/20; G11C 19/08; G11C 5/02; G10H 1/00
[52] U.S. Cl. .................................... 364/900; 365/1; 365/2; 84/1.01
[58] Field of Search ... 364/200 MS File, 900 MS File; 365/1, 2

[56] References Cited

PUBLICATIONS

Texas Instruments Inc., "Magnetic Bubble-Memory in Associated Circuits", Nov. 1978, pp. 1-15.
Intel Magnetics, "Bubble Memory Design Handbook," May 1979, pp. 1-2.
Rockwell, "RMS Single-Board Bubble Memory System," Document No. B-4, Rev. 1, Aug. 1980.
Trupp, R. D., "Improving Recorded-Announcement Service with Magnetic Bubbles," *Bell Laboratories Record*, Oct. 1977, pp. 249-252.
Cox, G. "Operation of a Block Replicate Bubble Memory System," *Computer Design*, Apr. 1979, pp. 186,170,172,174.

*Primary Examiner*—Raulfe B. Zache
*Attorney, Agent, or Firm*—Allison C. Collard; Thomas M. Galgano

[57] ABSTRACT

A solid state music player for reproducing and playing stored digital information from a magnetic bubble-memory device, which has a magnetic bubble-memory module for receiving the bubble-memory device which contains the stored program. There is also a function-timing generator, which is coupled to the magnetic bubble-memory module for generating control and timing signals for the module. A microprocessor is connected to a bubble-memory controller which in turn is coupled to the function-timing generator, and the bubble-memory controller responds to commands from the microprocessor to send control signals to the function-timing generator, necessary to access the digital data stored in the bubble-memory device. A digital-to-analog converter is coupled to the microprocessor for converting the digital stream of information from the microprocessor into analog signals, which then can be played through loudspeakers or on a video screen to reproduce the stored digital information from the bubble-memory device. In this manner, large amounts of stored information, such as musical programs or videotape programs, can be stored on a small bubble-memory chip and reproduced as desired.

10 Claims, 11 Drawing Figures

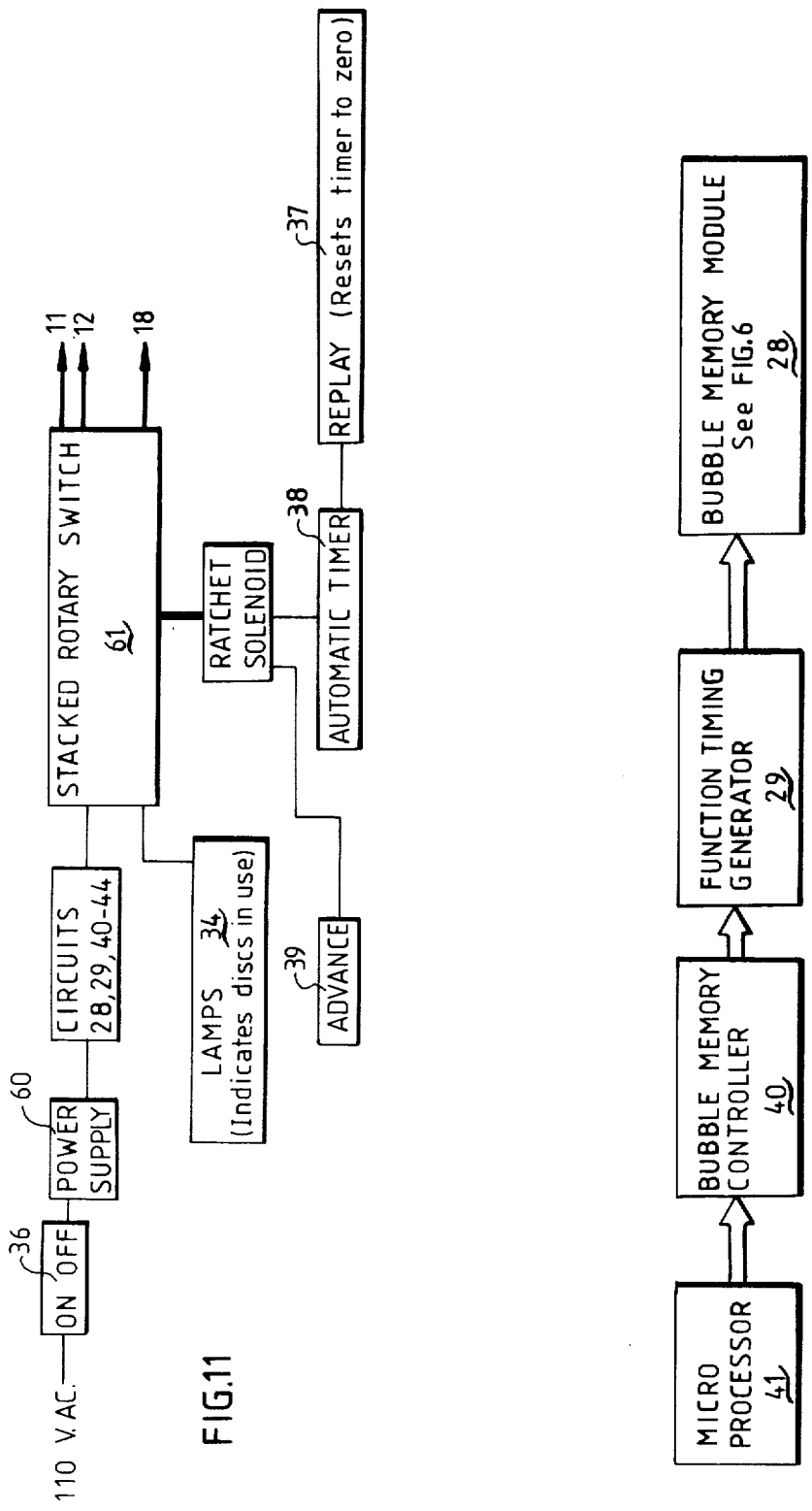

SOLID STATE MUSIC PLAYER USING SIGNALS FROM A BUBBLE-MEMORY STORAGE DEVICE

This invention is a continuation-in-part of Application Ser. No. 801,945, filed May 31, 1977 now abandoned.

This invention relates to a solid state digital encoder and playback system, which is capable of taking a large quantity of digital information, storing the information in a coded memory and playing back the information when needed.

More specifically, this invention relates to a digital information storage means, whereby a multitude of binary information can be stored in coded form in a bubble memory device, for later playback.

Devices for the storage of voice and music had their start in 1877 with Edison's invention of the phonograph. The first voice or music storage systems used cylinders having a soft surface, such as paraffin, for storing voice information on grooves, which were cut into the cylindrical surface by means of a vibrating needle. Around 1900, flat discs in the form of phonograph records were produced and manufactured from a shellac base. Grooves were spirally formed on the records, so that three or four minutes of voice or music information could be recorded on each side. The flat phonograph disc allowed a master record to be used in pressing a plurality of phonograph records for mass distribution. Later improvements in the phonograph record resulted in techniques of forming microgrooves on vinyl discs, so that over 20 minutes of music or voice could be recorded on each side of the disc. In the 1930's, wire recorders also became available for recording music and voice information on a single strang of wire moving at 15 inches per second past a recording head. Later refinements to magnetic recorders resulted in the development of the magnetic tape so that music or voice could be recorded at 1 7/8 inches per second on a multitude of channels on the same tape. Tape recordings, however, have the disadvantage in not lending themselves to mass production since each of the tapes has to be individually recorded rather than being stamped out as in the case of phonograph records. Moreover, in both phonograph and tape recording systems, unreliable mechanical systems such as turntables and tape drives with motors have to be provided for moving the mechanically or magnetically stored information past a statically mounted pickup device. The friction of the substrate containing the stored information passing the pickup device also tends to wear out either the pickup defice or the stored information so that there are a limited number of playbacks possible before distortion or other problems become apparent.

With the advent of solid state memory devices such as microprocessors, RAM and ROM memory devices, during the middle 1970s, it has been possible to store very short intervals of music or voice on solid state memory chips. For example, in the applicant's U.S. Pat. No. 3,998,045 a solid state taking timepiece in the form of a wristwatch allows a human voice to be recorded on a plurality of solid state memory chips which are sequenced in response to the time of the watch so that short spoken voice signals can read out the time on the watch on a miniature loudspeaker.

In order to produce approximately 1 second of voice information such as in the solid state talking timepiece, solid state memories having at least 8,000 bits for each second of voice were required. Thus, in order to produce, for example, 12 spoken numbers, 12 individual chips having a memory of 8,000 bits per chip or 96,000 total bits of information would be required. Certain circuits have been developed to cut down the number of bits of information required for one second of voice information, by eliminating up to 95% of the non-essential frequencies and mechanical noises created during the production of a voice signal, so that one second of voice can now be produced with under 1,000 bits of information, sacrificing some of the fidelity of the voice. In order to play music, however, broader band widths of frequencies are required and, in some cases, it has been found necessary to provide over 288,000 bits of information per second to reproduce a musical score. Thus, a memory chip having approximately several million bits of information is required to produce a program of recorded music.

Accordingly, the present invention provides a system for recording voice or music on solid state digital non-erasable memory that greatly expands the amount of voice and music that can be recorded on solid state memory devices. Basically, the invention provides a checker, which comprises a bubble memory system having a large storage capacity, to provide digital sequences representing a voice rendition or a musical score.

In the system according to the invention, a musical score is converted into digital form by an analog to digital converter and fed onto a bubble memory disc or checker. The bubble memory is capable of storing a large multitude of digital bits of information, which represent a musical or voice rendition that may be several hours in length.

The magnetic bubble-memory technology was first introduced by Bell Telephone Laboratories in 1967. Research indicated that small cylindrical magnetic domains, which are called magnetic bubbles, can be formed in single-crystal thin films of synthetic ferrites or garnets when an external magnetic field is applied perpendicularly to the surface of the film. These bubbles can be moved laterally through the film by using a varying magnetic field. These characteristics of magnetic bubbles make them ideally suited for serial storage of data bits; the presence or absence of a bubble in a bit position is used to define the logic state. Since the diameter of a bubble is so small (as little as a tenth of a micrometer), many thousands of data bits can be stored in a single bubble-memory chip. The bubble memory is much like magnetic tape or magnetic disc memory storage in that it is nonvolatile, so that data is retained even when power is no longer applied to the chip. Since bubble memories are solid-state devices (there are no moving parts), they have higher reliability than tape or disc storage, and do not require any preventive maintenance. The bubble memory is also small and lightweight, and currently, chips are being produced having one million bits storage capacity.

The bubble-memory checker contains the bubble-memory chip, two magnetic field coils, and permanent magnets. A rotating magnetic field created by two mutually perpendicular coils causes the data in the form of magnetic bubbles to move serially through the magnetic film in a manner similar to data in a semiconductor shift register. Two permanent magnets provide non-volatility, and allow for the stable existence of magnetic-bubble domains. Interfacing circuits that are compatible with standard devices complete the memory module to allow a convenience building-block concept for the nonvolatile memory system.

The chip in the checker is composed of a nonmagnetic crystalline substrate, upon which a thin crystalline magnetic epitaxial film is grown. Only certain materials exhibit the properties necessary to form magnetic bubbles, and these include orthoferrites, hexagonal ferrites, synthetic garnets, and amorphous metal films. Among these, the synthetic garnets have the best combination of the desired properties. Synthetic garnets support the formation of small magnetic bubbles that allow high-density data storage. The bubbles are highly mobile and are stable over a fairly wide range of temperatures.

The material chosen for the substrate depends on several factors. The crystalline structure should be compatible with that of the magnetic film, it should have nearly the same coefficient of expansion, and it should be nonmagnetic. The most-used garnet substrate with these properties is gadolinium gallium garnet (GGG). The magnetic film grown on this substrate has a crystalline structure that will allow the formation of magnetic domains (bubbles) in a plane perpendicular to the substrate.

Without the influence of an external magnetic field, these magnetic domains form random serpentine patterns of equal area, minimizing the total magnetic energy of the magnetic film. The magnetic field of the serpentine domains tends to line up primarily along a single axis that is perpendicular to the plane of the film. If an external magnetic field is applied, its energy tends to expand domains polarized in the direction of the field and to shrink those polarized opposite to the field, until they become small cylinders embedded in a background of opposite magnetization. Viewed on end, these cylinders have the appearance of small circles or bubbles with diameters from 2 to 30 micrometers. Increasing the field further causes the bubble to collapse or to be "annihilated". The external field provides a bias that makes the bubbles stable. This bias, being a static field, can be readily provided by permanent magnets with no expenditure of power.

Once a bubble has been created, a method is then required to move the bubble domain along a predetermined path. This is accomplished by the deposition of chevron-shaped patterns of a soft magnetic material on the chip surface above the magnetic epitaxial film. When magnetized sequentially by a magnetic field rotating in the same plane, these chevron propagation patterns set up magnetic polarities that attract the bubble domain and establish motion. In actual practice, the rotating in-plane magnetic field is implemented by applying a two-phase alternating current to the two magnetic field coils that surround the chip.

During a write operation, data are introduced into the major loop by pulses of current through a hairpin loop of the generator. The major loop is essentially a unidirectional circular shift register, from which data can be transferred in parallel to the minor loops. Thus, a block of data is entered in the major loop and shifted until the first data bit is aligned with the most remote minor loop. At that time, each parallel transfer element receives a current pulse that produces a localized magnetic field, causing the transfer of all the bubbles in the major loop to the top bit position of the corresponding minor loop. Once data is written into the magnetic bubble memory, new data may be written only by first removing the old data by doing a destructive read. In this operation, bubbles are transferred from the minor loops and annihilated by running them into the Permalloy guard rail that usually surrounds bubble devices.

During a read operation, the data block to be accessed in the minor loops is rotated until it is adjacent to the major loop. At this time, the data block is transferred in parallel to the major loop. The block of data is then serially shifted to the replicator, where the data stream is duplicated. The duplicated data takes the path to the magneto-resistive detector element. The presence of a bubble in the detector lowers the resistance, resulting in a corresponding increase in detector current, which can be detected via a sense amplifier. The original data stream remaining in the major loop is rotated and transferred back into the minor loop, thus saving the data for further operations.

It is therefore an object of the present invention to provide a solid state information recording and playback system, which is capable of storing a multitude of digital information for later reproduction.

It is another object, according to the present invention, to provide a digital storage and playback system, which is simple in design, reliable in operation and inexpensive in cost.

Other objects and features of the present invention will become apparent from the following detailed description considered in connection with the accompanying drawings which disclose the embodiments of the invention. It is to be understood, however, that the drawings are designed for the purposes of illustration only, and not as a definition of the limits of the invention.

In the drawings, wherein similar reference characters denote similar elements throughout the several views:

FIG. 7 are the timing and control functions, which are used to drive the bubble-memory module of FIG 6;

FIG. 11 is an electrical block diagram, showing the switching of the circuits of the subject invention.

Figure 1:
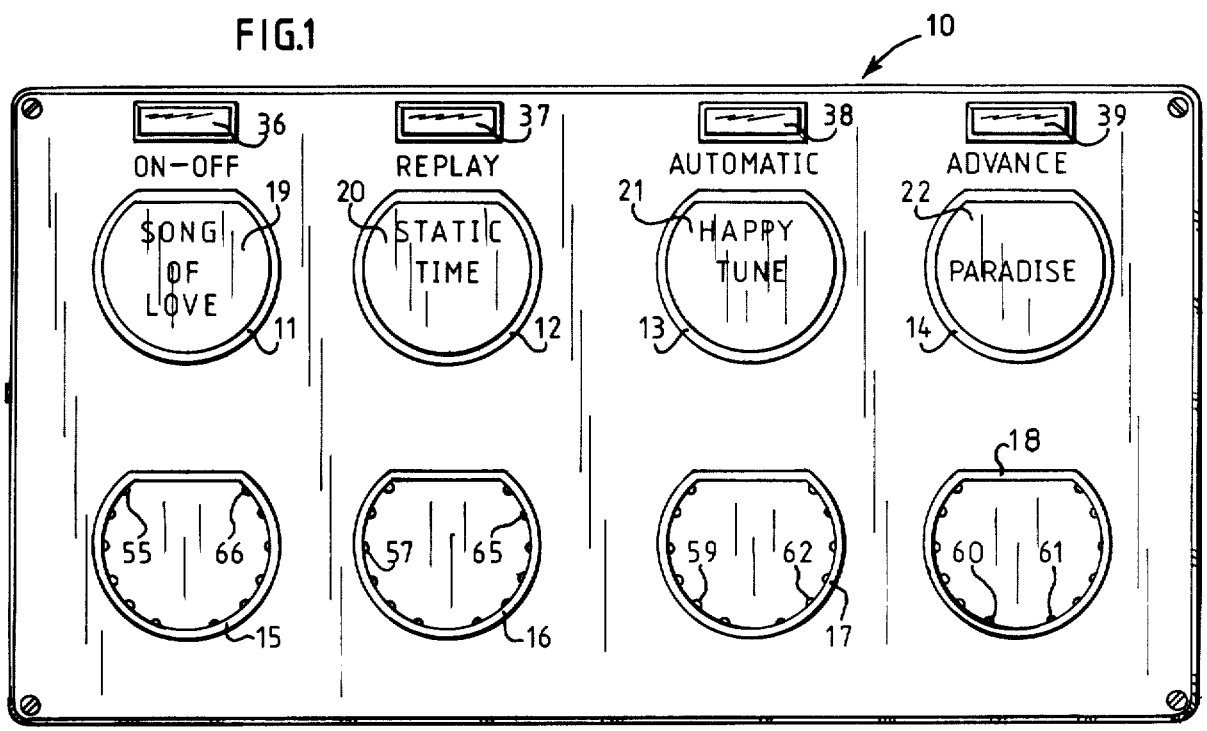
FIG. 1 is a top plan view of the musical system, according to the invention, showing the positions for mounting the bubble-memory discs used for storing the recorded information.
Figure 2:
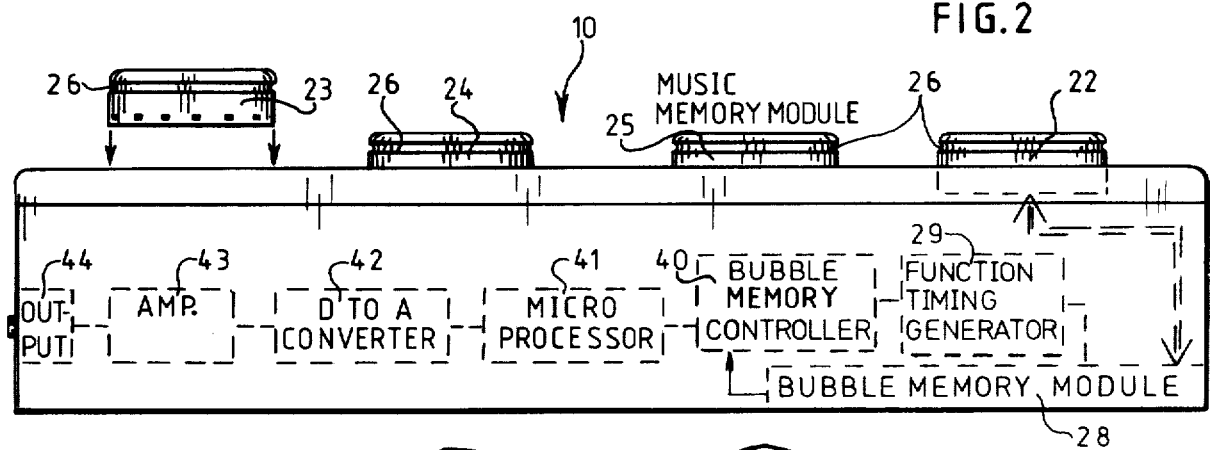
FIG. 2 is a side view, showing the system with a partial electrical block diagram depicting the circuit of the invention.
Figure 4:
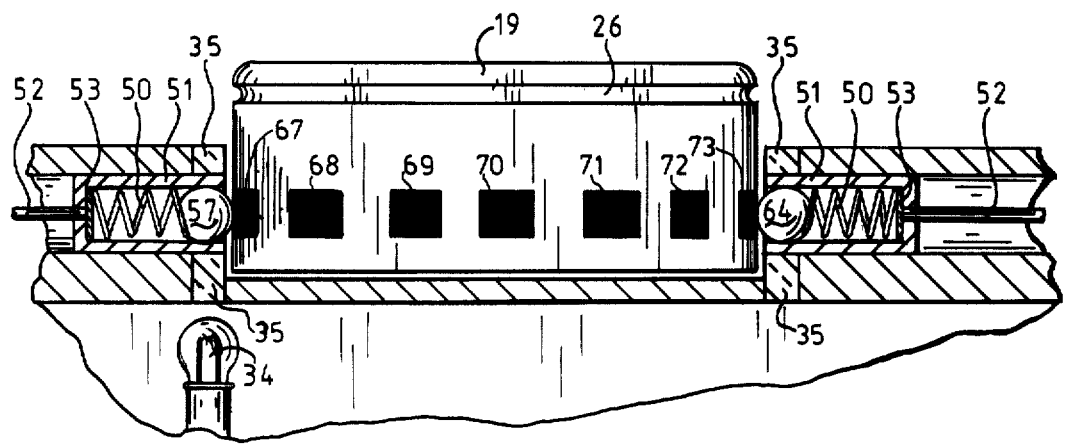
FIG. 4 is a partial, cross-sectional view taken through one of the receptacles, showing the bubble-memory circuit electrically coupled to a plurality of contacts.
Figure 5:
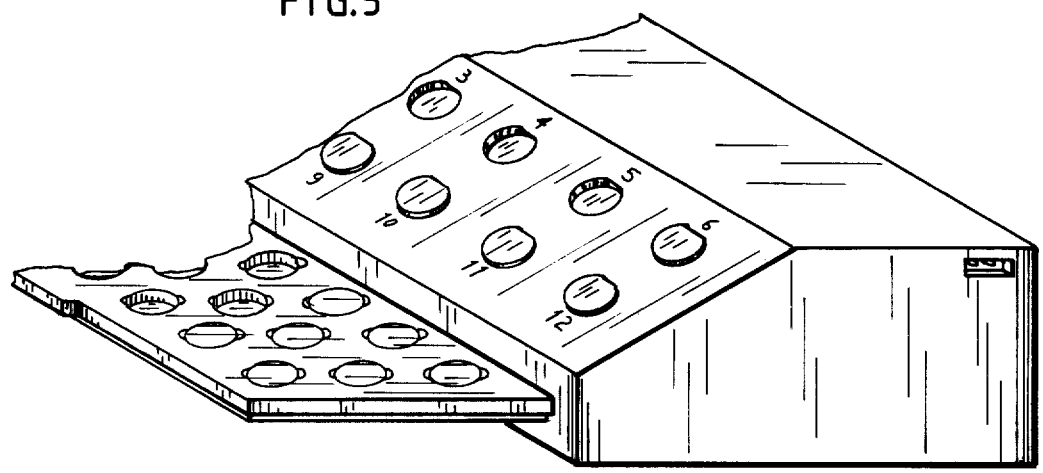
FIG. 5 shows another embodiment of the invention, wherein the musical-memory discs are placed on an inclined surface for playback, and can be stored in removable trays.

Referring to FIGS. 1 and 2, there is shown the playback system of the present invention, consisting of a housing 10 having a plurality of near circular openings 11–18, formed on the top surface for receiving memory discs or checkers 19–25, containing coded, recorded information. For example, checkers 19, 20, 21 and 22 contain the name of a song or tune printed on its top surface. The checkers are preferably slightly smaller in diameter than openings 11-18, and are provided with an annular finger-grip ring 26, integrally formed in each of the side walls, to allow easy removal of the checker. In openings 15-18, which do not contain checkers, there are provided twelve, spring-loaded ball contacts 55-66, which couple to corresponding contacts 67-73, as shown, and five other contacts not shown on the checker. In FIG. 4, checker 19 has a plurality of spaced-apart electrical terminals are contacts 67-73, which are spaced apart and aligned for making contact with receptacle ball contacts 55-67.

The bubble-memory checker is designed so that its flattened edge will fit against the corresponding flattened edge of the receptacle opening, and align its flat contacts with the ball contacts of the receptacle. The flat contacts of the checker are disposed only in the lower half of its side wall, so that if the checker is accidentally inserted upside down, there will be no electrical connection made to the receptacle ball contacts. A lamp 34 is also provided along each edge of openings 11-18. Each of the openings are preferably lined with a transparent plastic material 35, forming an illumination ring so that the material will be illuminated to show the particular checker being played.

The apparatus of FIG. 1 also includes an on-off button 36 for turning on and off the power to the system, a replay button 37 for replaying any particular chip, and an automatic button 38 for automatically sequencing the checkers 19-25 for long play. There is also provided an advance button 39 for manually advancing the selection from checkers 19 through 25.

In FIG. 2 there is shown a representative block diagram of the playback system, wherein the output coming from wires 52 of contacts 55-66, are coupled to a bubble-memory module 28, which receives the stored, coded information from the memory disc, samples the information, and processes it through a timing generator and controller to a microprocessor 41, and serially presents it to a digital-to-analog converter 42 for feeding it into an amplifier 43, which is connected to the output terminal 44 of the system. The bubble-memory controller 40 and function-timing generator 29 connected to the module 28, interface the checker to the microprocessor 41.

Figure 6:
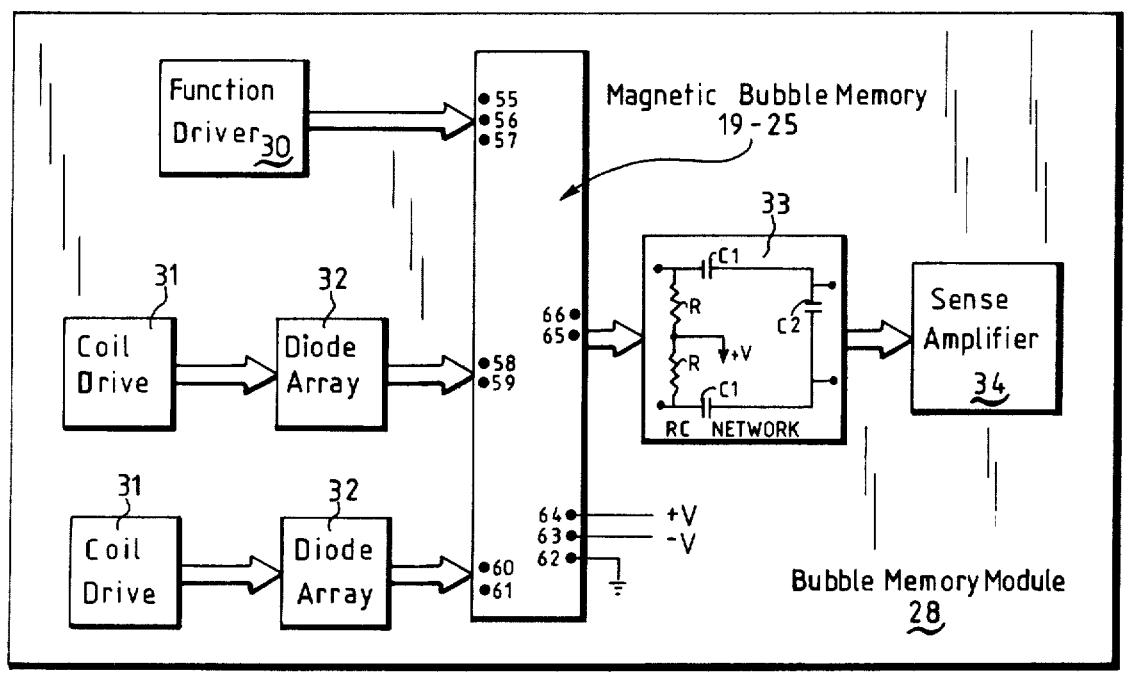
FIG. 6 is an electrical block diagram, showing a bubble-memory module, consisting of the magnetic bubble-memory chip and associated driver circuits.

Since the magnetic-bubble memory requires accurate current pulses for the generate, replicate, and transfer operations, an interface circuit called a function driver 30 is needed to convert the digital input control signals to the required current pulses, as shown in FIG. 6. Also, the two field coils each require a triangular current drive 90 degrees out of phase with each other. This requirement is satisfied with another set of interface circuits (coil drivers 31 and diode array 32) that is driven with digital input signals. The output signal amplitude of the MBM is relatively small, about 3 millivolts. For this to be useful in a system, the output is converted to standard TTL levels with the use of a set of interface circuits, consisting of IRC networks 33 and sense amplifiers 34. The block diagram in FIG. 6 shows the connection of all these interface circuits as a memory module. This modular building block promotes efficient construction of mass memories.

The control and timing signals for the memory module 28 are derived from function-timing generator 29. This integrated circuit provides input timing control to the function driver 30, coil drivers 31 and sense amplifier 34 on a per-cycle basis. The function-timing generator provides control signals to the memory module as shown in FIG. 7. These signals provide control for five basic operations: generate, replicate, annihilate, transfer-in and transfer-out. The function-timing generator 29 also initiates the rotating magnetic field and precisely synchronizes the timing of other control signals with this field.

The time at which a particular data bit is detected in the MBM may not exactly match the time at which it is needed in the system. The sense amplifier not only increases the voltage level of the detected data, but also provides temporary storage of the data bits in a circuit called a D-type flip-flop. The sense amplifier receives a control input from the function timing generator to transfer the detected data into the internal flip-flop. In addition, the function-timing generator provides the control signals necessary to put the existing data in a known position during a power shut down. When the system is turned on again, the stored data can then be accurately located and retrieved.

In the present system, the major computing and data processing is done by microprocessor 41. To provide a convenient interface from the microprocessor to the MBM system, a custom controller is needed for the read, write, and memory-addressing operations. The bubble-memory controller 40 responds to commands from microprocessor 41 and sends control signals to the function-timing generator necessary to access a page (or pages) of data. The controller 40 maintains page-position information, handles serial-parallel data conversion between the bubble memory and the microprocessor, and generates the control signals to the function-timing generator to perform read and write operations, while handling the redundancy of the minor loops.

Figure 3:
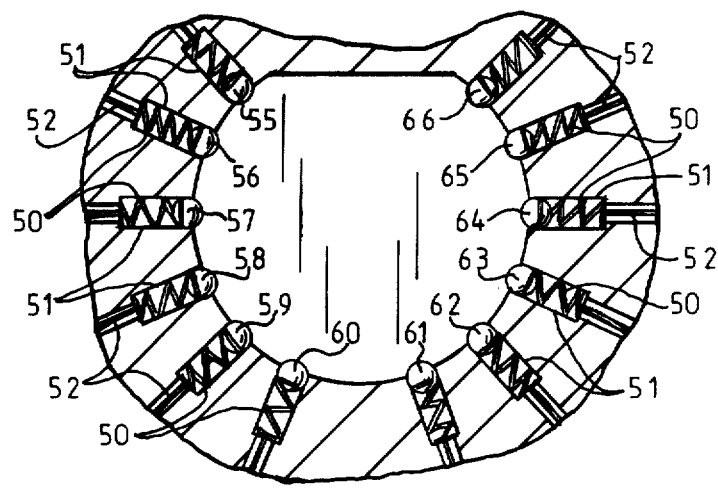
FIG. 3 is a top view in cross section, of one of the memory disc receptacles used in FIG. 1, showing the contacts in the form of circular rings.

FIG. 3 is a detailed, cross-sectional view of the mounting of ball contacts in each of receptacles 11-18. Each of the contacts are comprised of a metal ball 55-66, having a diameter slightly larger than the opening in the side wall of the receptacle, so that only a portion of the ball projects into the opening. Springs 50 are disposed in cylinders 51 and are compressed to urge the ball contacts against the walls of the checker. Conductor 52, which terminates in a flat disc 53 within metal cylinder 51, makes electrical contact with the ball, through metal spring 51 and the cylinder walls.

In order to convert the voice or music program into a digital form to record on the magnetic-bubble memory chip, a digitized bit stream is created equivalent to analog music mechanized through regenerative shift register techniques, which are non-volatile. The synthesis of the bit stream is carried out through feedback shift registers, where the length of the registers is much shorter than the length of the bit stream. In a maximal sense, it is possible to use a shift register of length "N" to provide a non-repeating sequence of length $2^n-1$. The digitized bit stream analagous to the music may require a sub-optimal length; but, nevertheless, a much higher efficiency is realizable than brute force storage of the bit stream in memory. The information pattern corresponds to a digital serial bit stream that represents the music/voice pattern shown in FIG. 9.

Figure 9:
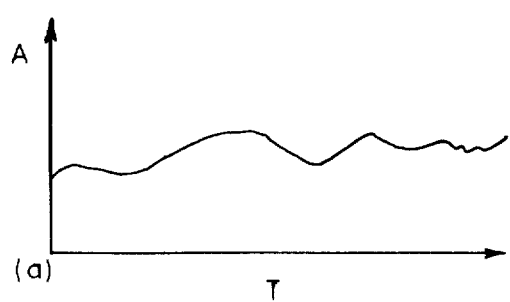
FIG. 9 is a plot of frequency versus time.
Figure 10:
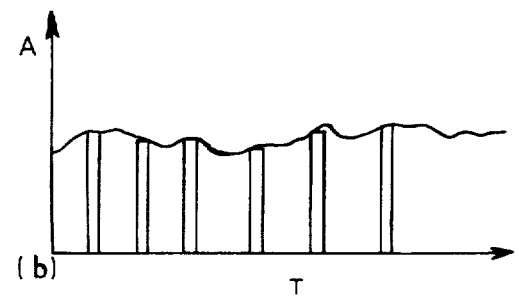
FIG. 10 is a plot of frequency versus time, with bit patterns inserted.

The original music/voice program in FIG. 9 is sampled at a rate equal to at least twice the highest frequency component present. For voice, this would be about 3 KHz, and for different music quality, about 12 KHz to 20 KHz. This would correspond to 6,000, 24,000 and 40,000 samples per second, respectively. The sampled information, as shown in FIG. 10, is now A/D converted into 3 or 4 levels. Or, in other words, each analog sample would be resolved into 8 ($2^3$) or 16 ($2^4$). As an example, the information in FIG. 12 is sampled at ten time-points, as shown with amplitudes ranging between 8 and 15 (the amplitude scale is volts, millivolts or some other convenient scale in volts).

| Time | Amplitude | Bit Pattern |
|---|---|---|
| 1 | 10 | 1010 |
| 2 | 14 | 1110 |
| 3 | 14 | 1110 |
| 4 | 10 | 1010 |
| 5 | 9 | 1001 |
| 6 | 10 | 1010 |
| 7 | 13 | 1110 |
| 8 | 15 | 1111 |
| 9 | 12 | 1100 |
| 10 | 8 | 1000 |

Figure 8:
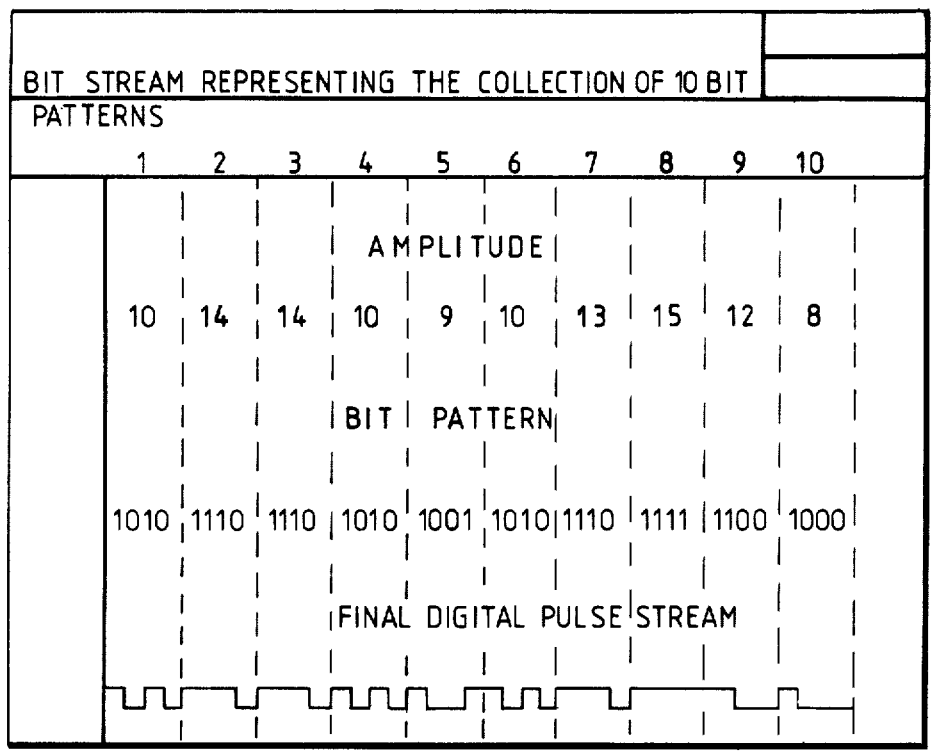
FIG. 8 illustrates a stream of bits representing the collection of a 10-bit pattern for different amplitude readings.

The bit pattern corresponding to each amplitude point is the binary equivalent of that amplitude number. The bit stream that represents the collection of 10 bit patterns is shown in FIG. 8. This pulse stream represents the final output of the proposed device. To recover the voice/music, the previous process is reversed. The digital pulse stream is now D/A converted into a series of amplitude varying pulses, as shown in FIG. 10, and then a simple RC integrating filter can be used to synthesize the desired signal, as shown in FIG. 9. The above describes the conversion into a pulse stream, and the recovery back into an analog signal.

In the present invention, it may also be possible to permit the storage of TV programs, with both sound and video presentation, on checkers which can be played back. A speaker or video screen would then be connected to the output 44 of amplifier filter 43. The method and system of the present invention thus permits a digital stream of information of many millions or billions of bits of information that are contained on a non-volatile checker or memory unit, to be processed and played by conversion of the digital information into analog audio or video signals.

In the invention, as shown in FIG. 6, function drives 30 is preferably a Texas Instrument (TI) type SN 75380, and coil drives 31 are TI Type SN 75382. Diode arrays are TI Type VSB53, and sense amplifier 34 is TI Type SN 75281. In the RC network, $C_1$ is 0.1 μf, R=3.4 kohms and $C_2$ is 470 pf. The magnetic-bubble memory may be TI Types TIB 020301, TIB 0203-2 or TIB 0203-3, depending on the storage capacity.

In FIG. 7, controller 40 may be a TI Type TMS 5502 and function-timing generator 29 may be a TI Type SN74LS361.

FIG. 11 shows the operational block diagram of the system, according to the invention, wherein the on-off button 36 is shown connected to a AC-DC power supply 60, which is connected to the electronic circuits 28, 29 and 40-44, shown in FIG. 2. The circuits are connected to a stacked rotary switch 61, which is operated by its own ratchet selenoid. Stacked rotary switch 61 is a multi-layer switch, which is connected to each of the bubble-memory checker receptacles 11-18, so that a single set of 12 contacts located in one receptacle, can be connected to the circuits in response to the advance button 39. Each time the advance button is depressed, the ratchet selenoid of the stacked rotary switch will move the switch one further position, so that the contacts of the next bubble-memory checker receptacle, can be activated, together with its respective illumination lamp 34, to begin the playing of the next bubble-memory checker.

Automatic button 38 may be an electric timer or may be made responsive to a keyed signal at the end of each musical program recorded on the bubble-memory checker, so that the program can be switched from, for example, receptacle 11 to receptacle 12, and begin playing the next checker. If the same checker is to be replayed once again, replay button 37 can be depressed, and that will block the automatic advance, so that the same program will be repeated one more cycle. Both automatic button 38 and replay button 37 are connected to the ratchet selenoid, which activates rotary switch 61. Replay button 37 resets the timer to 0, so that the same selection will be replayed. Each time the rotary stack switch is operated, it will also transfer to another lamp 34 of one of the receptacles, indicating the receptacle that is in use, or the selection being played. Each of the lamps 34 is connected directly to the stacked rotary switch. The purpose of the stacked rotary switch 61 is to isolate each of the contacts 55-66 for each of the receptacles, from every other receptacle, so that there is no interference between adjacent bubble-memory checkers or discs, when a number of selections are inserted into the music player.

While only a few embodiments of the present invention have been shown and described, it will be obvious that many modifications may be made thereunto, without departing from the spirit and scope of the invention.

What is claimed is:

1. A solid state music player for reproducing and playing stored digital information from a magnetic bubble-memory device having exposed terminals, comprising:
   a bubble-memory module for receiving the bubble-memory device, which contains the stored program;
   a function-timing generator, which is coupled to said bubble-memory module for generating control and timing signals for said module;
   a bubble-memory controller coupled to said function-timing generator and said bubble-memory module;
   a microprocessor coupled to said bubble-memory controller the bubble-memory controller responding to commands from the microprocessor, to send control signals to the function-timing generator, necessary to access the digital data stored in the module, and reading stored digital information from said bubble-memory module, the controller performing a serial-to-parallel conversion of the stored data as the data is transmitted from said module to said microprocessor;
   a digital-to-analog converter coupled to said microprocessor for converting the stream of digital information from the microprocessor into the analog signals;
   amplifier means coupled to said converter for amplifying the converted analog signals;
   a housing having a plurality of receptacles disposed in its top surface; and
   a plurality of electrical contacts coupled to said bubble-memory module and disposed in each of said receptacles along its peripheral walls, for contact with corresponding terminals on the bubble-memory device.

2. The solid state music player, as recited in claim 1, wherein said bubble-memory module comprises:
- a function driver, coupled to the magnetic bubble-memory device;
- a plurality of coil drivers coupled to the magnetic bubble-memory device; and
- an RC network and sense amplifier, coupled to the magnetic bubble-memory device.

3. The solid state music player, as recited in claim 1, wherein each of said contacts comprises a ball, a cylinder containing the ball at one end thereof, a spring mounted in said cylinder and urging said ball to extend slightly beyond the side wall of said receptacle, and an electrical conductor coupled to said ball spring and ball at the opposite end of said cylinder for completing the electrical connection to the terminals of the bubble-memory device.

4. The solid state music player, as recited in claim 3, wherein each of said receptacles comprises a substantially cylindrical cavity, having a partial flat wall thereof, for orientating a corresponding cylindrical bubble-memory device into the proper electrical alignment.

5. The solid state music player, as recited in claim 3, wherein the contacts of each of said receptacles are coupled to a stacked rotary switch means, the output of which is coupled to said bubble-memory module, and actuating means coupled to said stacked rotary switch means, for selectively operating said switch means, to change the contacts coupled to said module from one receptacle to a further receptacle.

6. The solid state music player, as recited in claim 5, wherein said actuating means comprises an advance switch for advancing said stacked rotary switch means, to the contacts of the next receptacle, automatic timer means for switching said stacked rotary switch to the contacts of the next receptacle after a pre-determined time interval, and replay means for resetting said automatic timer means to replay the bubble-memory device in the same receptacle.

7. The solid state music player, as recited in claim 6, additionally comprising an illumination ring surrounding each of said receptacles, and a lamp mounted adjacent to said illumination ring, and responsive to said rotary switch means, for illuminating the receptacle that is coupled to the memory module for playback.

8. A bubble-memory device, comprising:
- a substantially cylindrical housing, having at least part of its circular wall flattened, and a plurality of spaced-apart electrical terminals disposed around the walls of said housing; and
- a magnetic memory-bubble chip disposed within said housing and electrically coupled to said plurality of spaced-apart terminals.

9. The bubble-memory device, as recited in claim 8, wherein said terminal are disposed along the periphery of said wall below the lower half of the wall of said cylindrical housing.

10. The magnetic bubble-memory device, as recited in claim 9, wherein said housing includes along its upper periphery, an annular groove formed within said housing adjacent to its top surface.

* * * * *